(12) United States Patent
Mitani et al.

(10) Patent No.: US 7,619,274 B2
(45) Date of Patent: Nov. 17, 2009

(54) NONVOLATILE SEMICONDUCTOR MEMORY DEVICE AND METHOD OF MANUFACTURING THE SAME

(75) Inventors: Yuichiro Mitani, Miura-gun (JP); Daisuke Matsushita, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 11/083,035

(22) Filed: Mar. 18, 2005

(65) Prior Publication Data

US 2005/0285180 A1 Dec. 29, 2005

(30) Foreign Application Priority Data

Jun. 23, 2004 (JP) ............... 2004-185497

(51) Int. Cl.
*H01L 29/51* (2006.01)

(52) U.S. Cl. ............... 257/315; 257/E21.422; 257/E29.3

(58) Field of Classification Search ......... 257/314–323, 257/E21.209, E21.422, E29.3
See application file for complete search history.

(56) References Cited

U.S. PATENT DOCUMENTS

| | | | |
|---|---|---|---|
| 5,739,569 A | | 4/1998 | Chen |
| 6,858,906 B2* | | 2/2005 | Lee et al. ............ 257/406 |
| 2002/0118566 A1* | | 8/2002 | Jong et al. ............ 365/185.03 |
| 2002/0142624 A1* | | 10/2002 | Levy et al. ............ 438/786 |
| 2004/0061169 A1* | | 4/2004 | Leam et al. ............ 257/315 |

FOREIGN PATENT DOCUMENTS

| | | |
|---|---|---|
| JP | 01-169932 A | 7/1989 |
| JP | 01-307272 A2 | 12/1989 |
| JP | 05-036991 A | 2/1993 |
| JP | 08-031958 A | 2/1996 |
| JP | 09-064205 A | 3/1997 |
| JP | 09-153492 A | 6/1997 |
| JP | 2000-004018 A2 | 1/2000 |
| JP | 2003-347543 A | 12/2003 |
| JP | 2004-095918 A | 3/2004 |

OTHER PUBLICATIONS

Wang, Xue-seng et al. al, Crystalline Si3N4 thin films on Si(111) and the 4×4 reconstruction on Si3N4(0001), Rapid Communications, The American Physical Society, Physical Review B, vol. 60 No. 4 pp. R2146-R2149.*

(Continued)

*Primary Examiner*—Lynne A. Gurley
*Assistant Examiner*—Colleen A Matthews
(74) *Attorney, Agent, or Firm*—Finnegan, Henderson, Farabow, Garrett & Dunner, L.L.P.

(57) ABSTRACT

A nonvolatile semiconductor memory device includes a floating gate electrode which is selectively formed on a main surface of a first conductivity type with a first gate insulating film interposed therebetween, a control gate electrode formed on the floating gate electrode with a second gate insulating film interposed therebetween, and source/drain regions of a second conductivity type which are formed in the main surface of the substrate in correspondence with the respective gate electrodes. The first gate electrode has a three-layer structure in which a silicon nitride film is held between silicon oxide films, and the silicon nitride film includes triple coordinate nitrogen bonds.

5 Claims, 15 Drawing Sheets

OTHER PUBLICATIONS

S. Tsujikawa et al., "An Ultra-Thin Silicon Nitride Gate Dielectric With Oxygen-Enriched Interface (Ol-SiN) for CMOS With EOT of 0.9 nm and Beyond", Symposium On VLSI Technology, Digest of Technical Papers, pp. 202-203, (2002).

Xiang et al., "Extending the Life of N/O Stack Gate Dielectric With Gate Electrode Engineering", IWGI, pp. 134-139, (2003).

Matsushita et al., "Semiconductor Device Manufacturing Method", U.S. Appl. No. 10/941,814, filed Sep. 16, 2004.

Notification of the First Office Action, The Patent Office of the People's Republic of China, in Chinese Application No. 200510079464.7 dated Oct. 12, 2007.

Notification of Reasons for Rejection mailed Jan. 6, 2009, from the Japanese Patent Office in corresponding Japanese Patent Application No. 2004-185497, and English language translation thereof.

Yang et al., "Reliability considerations in scaled SONOS nonvolatile memory devices," Solid-State Electronics, 1999, pp. 2025-2032, vol. 43.

\* cited by examiner

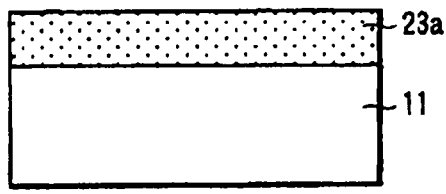
FIG. 5A
(PRIOR ART)
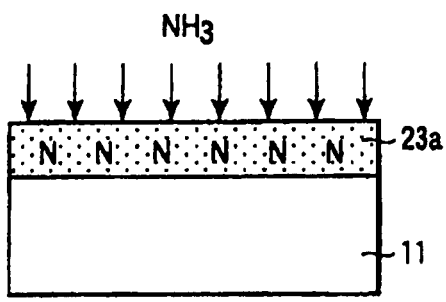
FIG. 5B
(PRIOR ART)
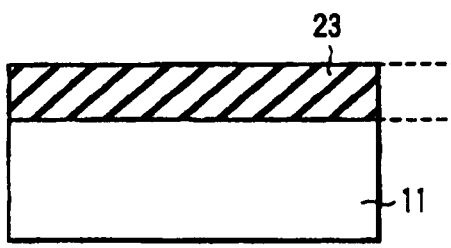
FIG. 5C
(PRIOR ART)
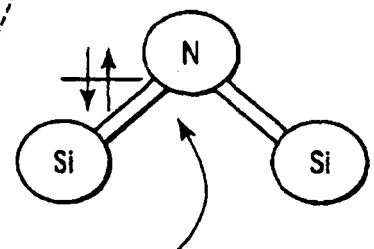
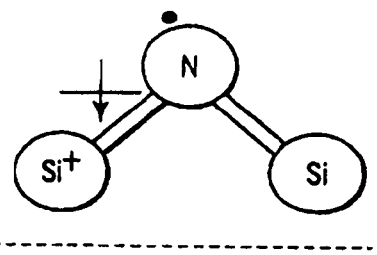

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2004-185497, filed Jun. 23, 2004, the entire contents of which are incorporated herein by reference.

BACKGROUND OF THE INVENTION

1. Field of the Invention

This invention relates to a nonvolatile semiconductor memory device having a stacked gate structure formed by stacking a floating gate electrode and a control gate electrode on a semiconductor substrate, and a method of manufacturing the same. In particular, this invention relates to a nonvolatile semiconductor memory device and a method of manufacturing the same for improving a tunnel insulating film between a floating gate electrode and a substrate.

2. Description of the Related Art

Recently, in electrically programmable and erasable nonvolatile semiconductor memory devices (EEPROM), scale down of the devices has been being rapidly promoted. In EEPROMs, there has been adopted a method in which electrons are injected into a floating gate electrode from a substrate through a tunnel oxide film (writing), or electrons in the floating gate electrode are extracted therefrom (erase), by applying a high voltage to a control gate electrode.

In this operation, a high voltage is required to inject or extract electrons into (from) the floating gate electrode, and a large stress is applied to the tunnel oxide film. Thereby, a defect called "trap" is generated in the tunnel oxide film, a leak current increases, and data holding property and the like are hindered. A leak current caused by stress application strongly depends on the film thickness of the tunnel oxide film. The thinner the tunnel oxide film is, the more likely the leak current flows. This phenomenon is a large factor which hinders reduction in the thickness of the tunnel oxide film.

As means for solving the problem, adopted is a method in which nitrogen is introduced into the tunnel oxide film, thereby a dielectric constant thereof as the tunnel insulating film is increased and physical film thickness of the film is increased to reduce the leak current. In this method, nitrogen introduced into the tunnel insulating film, by annealing a silicon oxide film by ammonia ($NH_3$) gas, carbon monoxide (NO) gas, or dinitrogen monoxide ($N_2O$). However, in treatment using $NH_3$ gas or the like, a large amount of hydrogen is introduced into the tunnel insulating film, and an after heat treatment at high temperature is required to secure the reliability of the device. Further, treatment using NO or $N_2O$ has a problem, such as increase in the hole trap amount in stress application, which deteriorates the reliability (Jpn. Pat. Appln. KOKAI Pub. No. 1-307272).

In the meantime, to increase the coupling ratio between the control gate electrode and the floating gate electrode, it has been proposed to use an insulating film having a dielectric constant higher than that of the conventional silicon oxide film and silicon oxynitride film as an interelectrode insulating film. However, if a high-dielectric-constant insulating film, such as a metal oxide, is used as an interelectrode insulating film, the metal diffuses into the tunnel insulating film through the floating gate electrode, and greatly deteriorates the reliability of the device.

As described above, as the tunnel insulating film of EEPROMs, required is an insulating film which does not easily form traps due to high-voltage stress application and has a reduced leak current. However, in prior art, it is very difficult to meet such specs. Further, using a high-dielectric-constant insulating film such as a metal oxide the interelectrode insulating film causes the problem that the metal is diffused through the floating gate electrode into the tunnel insulating film and causes deterioration in the reliability of the tunnel insulating film.

BRIEF SUMMARY OF THE INVENTION

According to an aspect of the present invention, a nonvolatile semiconductor memory device comprises: a semiconductor substrate of a first conductivity type; a gate element formed on the semiconductor substrate, and comprising: a first gate insulating film which is selectively formed on a main surface of the semiconductor substrate, the first gate insulating film forming a three-layer structure including a silicon nitride film and silicon oxide films between which the silicon nitride film is sandwiched, the silicon nitride film including triple coordinate nitrogen bonds; a floating gate electrode formed on the first gate insulating film; a second gate insulating film formed on the floating gate electrode; and a control gate electrode formed on the second gate insulating film; and source and drain regions of a second conductivity type, the source and drain regions being formed in the main surface of the substrate with the gate element being arranged between the source and drain regions.

According to another aspect of the present invention, a method of manufacturing a nonvolatile semiconductor memory device, comprises: forming a silicon nitride film by directly nitriding a main surface of a silicon substrate of a first conductivity type, followed by heating the substrate in an oxidizing atmosphere, to form silicon oxide films, one in an interface between the silicon nitride film and the substrate and the other on the silicon nitride film, the silicon oxide films and the silicon nitride film and forming a first gate insulating film; forming a floating gate electrode on the first gate insulating film; forming a second gate insulating film on the floating gate electrode; forming a control gate electrode on the second gate insulating film; and forming source and drain regions of a second conductivity type in the main surface of the substrate with the first gate insulating film being arranged between the source and drain regions.

According to another aspect of the present invention, a method of manufacturing a nonvolatile semiconductor memory device, comprises: forming a silicon nitride film by directly nitriding a main surface of a silicon substrate of a first conductivity type, followed by forming a silicon film on the silicon nitride film, followed by heating the substrate in an oxidizing atmosphere to oxidize the silicon film and form a first silicon oxide film, and forming a second silicon oxide film in an interface between the silicon nitride film and the substrate, the silicon nitride film, the first silicon oxide film and the second silicon oxide film forming a first gate insulating film; forming a floating gate electrode on the first gate insulating film; forming a second gate insulating film on the floating gate electrode; forming a control gate electrode on the second gate insulating film; and forming source and drain regions of a second conductivity type in the main surface of the substrate with the first gate insulating film being arranged between the source and drain regions.

BRIEF DESCRIPTION OF THE SEVERAL VIEWS OF THE DRAWING

FIGS. 5A to 5C are schematic diagrams for explaining the effect of the first embodiment, illustrating steps for forming a silicon nitride film and a bond state of nitrogen in prior art.

DETAILED DESCRIPTION OF THE INVENTION

Details of the present invention will be explained with reference to embodiments shown in drawings.

First Embodiment

Figure 1:
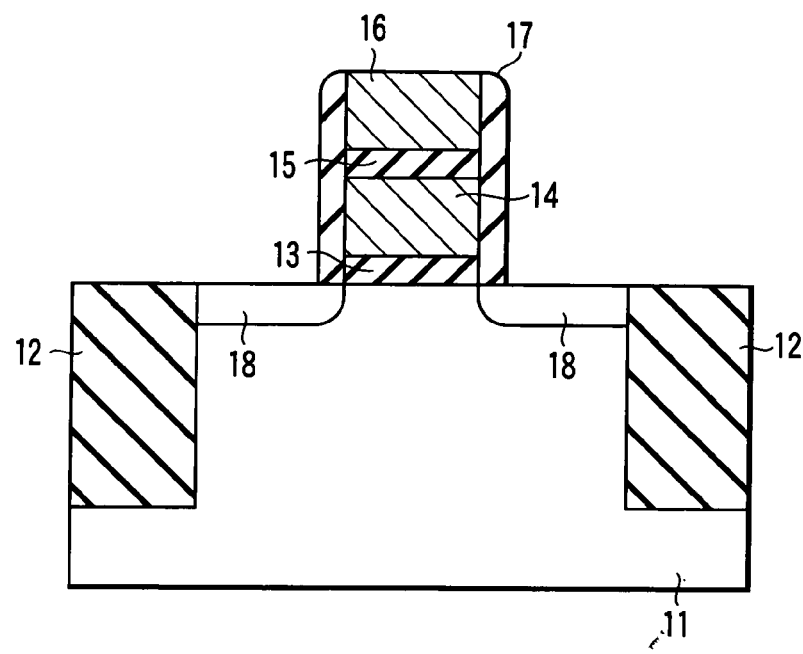
FIG. 1 is a cross-sectional view illustrating a schematic structure of a nonvolatile semiconductor memory device according to a first embodiment of the present invention.

FIG. 1 is a cross-sectional view illustrating a schematic structure of a nonvolatile semiconductor memory device according to a first embodiment of the present invention.

Silicon oxide films 12 for device isolation are embedded in a p-type (first conductivity type) silicon substrate 11, to surround a device region in a main surface of the silicon substrate 11. On the main surface of the silicon substrate 11, a floating gate electrode 14 is formed with a tunnel insulating film (first gate insulating film) 13 interposed therebetween. A control gate electrode 16 is formed on the floating gate electrode 14 with an interelectrode insulating film (second gate insulating film) 15 interposed therebetween. The interelectrode insulating film 15 is an ONO film formed of a silicon oxide film, a CVD silicon nitride film, and a CVD silicon oxide film and having a 7 nm thickness. Each of the floating gate electrode 14 and the control gate electrode 16 is formed of a polycrystalline silicon film.

A silicon oxide film 17 is formed on side surfaces of a gate electrode portion comprising the tunnel insulating film 13, the floating gate electrode 14, the interelectrode insulating film 15 and the control gate electrode 16. In the main surface of the substrate 11, n type source/drain diffusion layers 18 are formed by phosphorous ion implantation, with the gate electrode portion used as a mask.

Figure 2A:
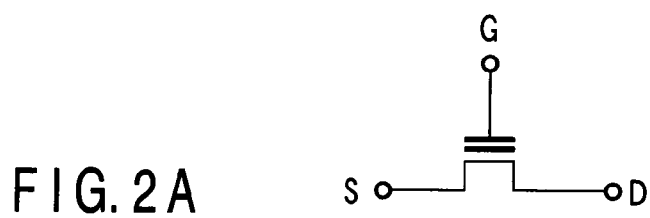
FIGS. 2A and 2B are diagrams illustrating equivalent circuits of the nonvolatile semiconductor memory device of FIG. 1 and a NAND cell unit using the same.
Figure 2B:
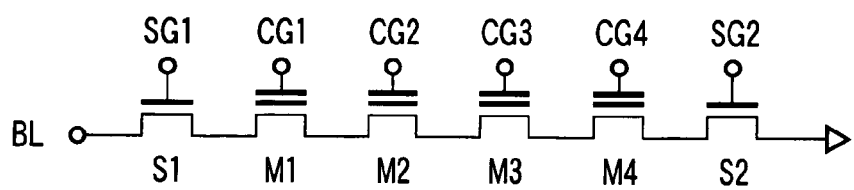

An equivalent circuit of the nonvolatile semiconductor memory device of FIG. 1 is similar to a common EEPROM cell as shown in FIG. 2(a). A NAND cell unit is formed by connecting a plurality of the equivalent circuits in series, as shown in FIG. 2(b). In FIG. 2(b), M1 to M4 are memory cells, and S1 and S2 are selective transistors.

Figure 3:
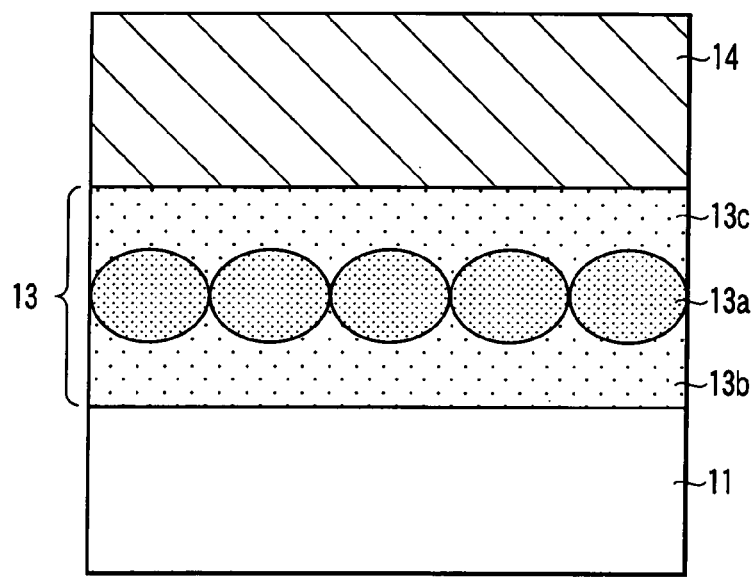
FIG. 3 is a cross-sectional view illustrating a structure of a tunnel insulating film used in the first embodiment.

The basic structure of the present invention described above is the same as that of a conventional device. In this embodiment, however, the structure of the tunnel insulating film 13 is different from that of the conventional device. Specifically, as shown in FIG. 3, the tunnel insulating film 13 of this embodiment has a stacked structure in which a silicon nitride film 13a is sandwiched by silicon oxide films 13b and 13c. The silicon nitride film 13a is obtained by directly nitriding the silicon substrate 11. By performing the nitriding at high temperature, the bond state of nitrogen is set to triple coordinate (that is, nitrogen has three bonds to silicon), as shown in FIG. 4.

Figure 4:
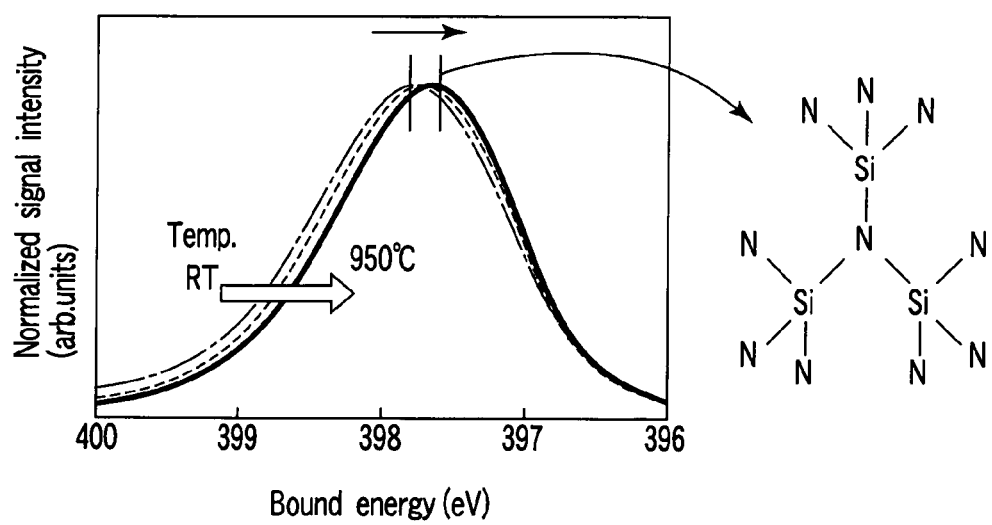
FIG. 4 is a schematic diagram for explaining the effect of the first embodiment, illustrating a bond state of nitrogen.

FIG. 4 illustrates the relationship between the bound energy and the normalized signal intensity, obtained by XPS (X-ray photoelectron spectroscopy). As shown by a solid line in FIG. 4, a high bound energy component, that is, low-density nitrogen bonds decrease by annealing at 950° C., and the bond state of nitrogen becomes triple coordination.

In the meantime, in a conventional silicon oxynitride film, a silicon oxide film 23a is formed by oxidizing a silicon substrate 11 as shown in FIG. 5A, and then nitrogen atoms (N) are injected into the film by exposing the film to, for example, ammonia ($NH_3$) gas atmosphere as shown in FIG. 5B. The nitrogen injected into the film as described above cleaves the bonds between silicon and oxygen in the silicon oxide film 23a, and the nitrogen is bonded to the silicon instead of the oxygen. However, it cannot form a triple coordination, but forms double coordinate nitrogen bonds. Therefore, as shown in FIG. 5C, the silicon nitride film 23 obtained in the end has double coordinate nitrogen bonds.

The double coordinate nitrogen bonds does not produce any dangling bonds in appearance since each bond of the nitrogen forms a double bond with silicon. However, this bond is unstable, and easily traps a hole. This is caused by formation of level in the vicinity of the valence band of the silicon in contact. Specifically, this is because a hole from the silicon side is trapped by applying a voltage, one bond of each nitrogen forming a double bond with the silicon is cleaved, and a positive fixed charge is easily formed on the silicon side, and a dangling bond and a defect on the nitrogen side.

In comparison with this, the silicon nitride film 13a in the tunnel insulating film 13 according to the embodiment has triple coordinate nitrogen bonds, and thereby nitrogen bonds are stabilized and are not easily cleaved by electrical stress application.

Figure 6:
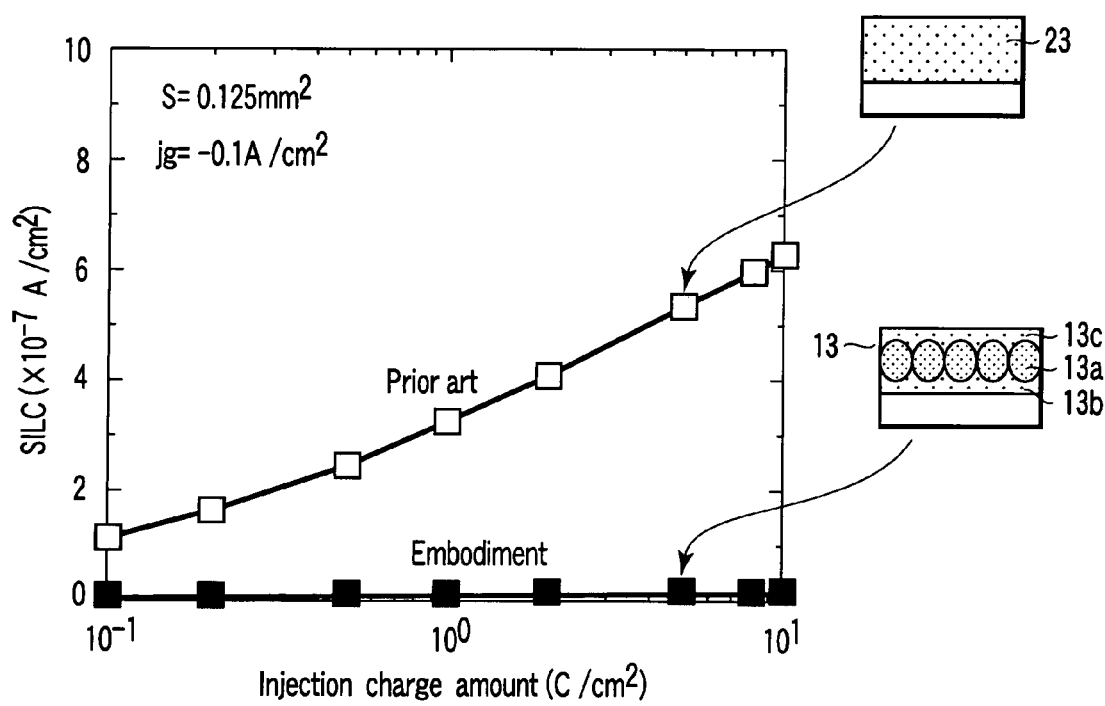
FIG. 6 is a characteristic diagram for explaining the effect of the first embodiment, illustrating a comparison between stress induction leak currents in tunnel insulating films according to prior art and the first embodiment.

FIG. 6 is a characteristic diagram comparing a tunnel insulating film of prior art and that of the present embodiment. In FIG. 6, electric stress is applied to each of the tunnel insulating films, and their leak currents (stress-induced leak current: SILC) increased by the stress are compared. Stress leak current is a leak current which flows through defects formed in an insulating film due to electric stress application. The more defects are formed in a film, the more the leak current increases.

FIG. 6 shows that the leak current in the tunnel insulating film according to the embodiment hardly increases, although the leak current in that of prior art monotonously increases with increase in the stress application time. Specifically, it shows that the embodiment of the present invention suppresses formation of defects in the film, and that the tunnel insulating film according to the embodiment is of a high quality. Further, the embodiment has a structure in which a silicon nitride film having triple coordinate bonds each having a stable structure is located in the central portion of the tunnel insulating film and held between silicon oxide films disposed on and under thereof. This structure can suppress formation of defects in and around the center of the film, which most contribute to a stress-induced leak current. Further, although not shown, since a silicon oxide film is formed in the interface on the silicon substrate side, the embodiment is also effective against well-known deterioration in the interface property and reliability due to nitrogen introduction.

As described above, the nonvolatile semiconductor memory device of the embodiment has the tunnel insulating film 13 having a three-layer structure in which the silicon nitride film 13a having a dielectric constant twice as large as the silicon oxide films is held between the silicon oxide films 13b and 13c, and the silicon nitride film 13a has triple coordinate nitrogen bonds. Therefore, the leak current is reduced even in a film having the same electric film thickness (oxide-film converted film thickness, EOT) as that of prior art. In particular, defect formation due to stress application (that is, in writing and erase with a high electric field) is suppressed, and stress-induced leak current is suppressed.

Further, since the silicon nitride film 13a has projections and depressions, the electric field is concentrated in the depressions, and the embodiment is also effective in reduction in the write voltage. Further, the stacked structure formed of the silicon oxide films 13b and 13c and the silicon nitride film 13a suppresses connection of defects due to high-voltage stress application from the substrate 11 side to the floating gate 14, and suppresses breakdown. Thereby, the life of the device is prolonged, and the device has a high reliability. Specifically, it is possible to obtain a high-quality and high-reliable tunnel insulating film 13 with reduced defects caused by stress application, and improve the reliability of a nonvolatile semiconductor memory device formed of fine elements.

Second Embodiment

FIGS. 7A to 7D are cross-sectional views illustrating steps of manufacturing a nonvolatile semiconductor memory device according to a second embodiment of the present invention.

Figure 7A:
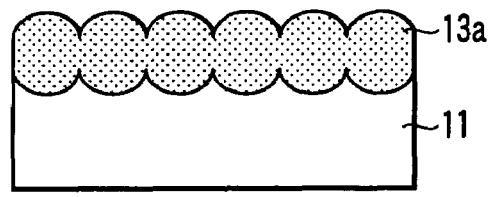
FIGS. 7A to 7D are cross-sectional views illustrating steps of manufacturing a nonvolatile semiconductor memory device according to a second embodiment.
Figure 7B:
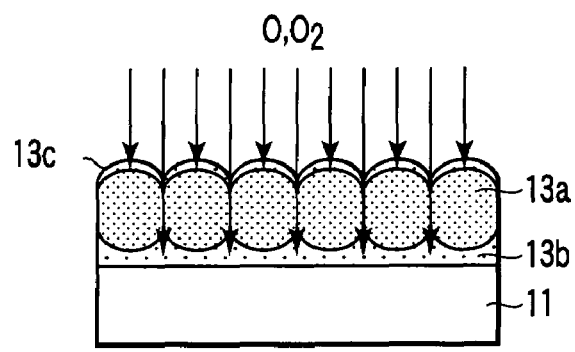

In this embodiment as shown in FIG. 7A, when a tunnel insulating film (first gate insulating film) is formed, a surface of a silicon substrate 11 is directly nitrided by using nitrogen plasma or the like, and a silicon nitride film 13a having, for example, a 4 nm thickness is formed. Thereafter, as shown in FIG. 7B, a bottom surface and a top surface of the silicon nitride film 13a are oxidized by using oxide gas or the like to form silicon oxide films 13b and 13c. The present embodiment is characterized in that the silicon nitride film 13a is formed to have triple coordination in this step and the surface of the silicon nitride film 13a is provided with projections and depressions as shown in FIG. 7A.

Supposing that the silicon nitride film of triple coordinate is flat, the oxygen gas introduced through the surface or oxygen atoms generated by the oxygen gas cannot be sufficiently diffused in the triple coordinate silicon nitride film since the film is stable. Therefore, the oxygen gas or the oxygen atoms cannot reach the interface on the bottom side of the silicon nitride film, and cannot form a silicon oxide film under the silicon nitride film. Thus, a thin oxide film is formed only on the surface of the silicon nitride film.

Figure 7C:
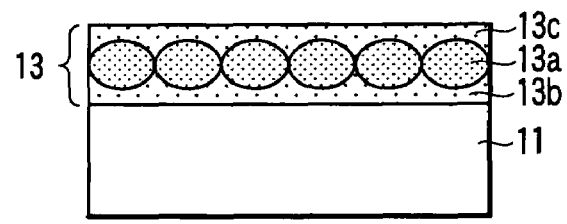
Figure 7D:
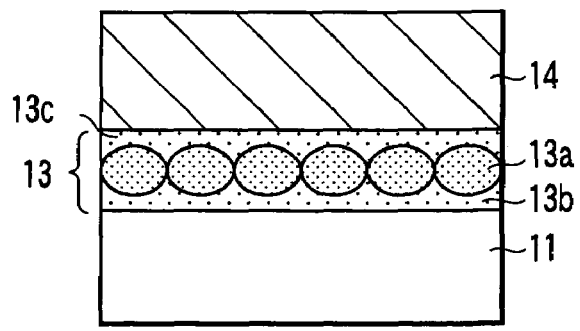

In comparison with this, in the second embodiment, since the triple coordinate silicon nitride film is stable and agglomerated, it has variance in the film thickness, and serves as the silicon nitride film 13a having projections and depressions as shown in FIG. 7A. Thereby, as shown in FIG. 7B, oxygen molecules or oxygen atoms pass between agglomerated parts of the silicon nitride film 13a. Therefore, the surface of the silicon nitride film is oxidized and the silicon oxide film 13c is formed, and simultaneously the silicon oxide film 13b is formed in the interface on the bottom side of the silicon nitride film. By the above steps, the tunnel insulating film 13 is formed as shown in FIG. 7C, and then a floating gate electrode 14 is formed as shown in FIG. 7D.

Figure 8:
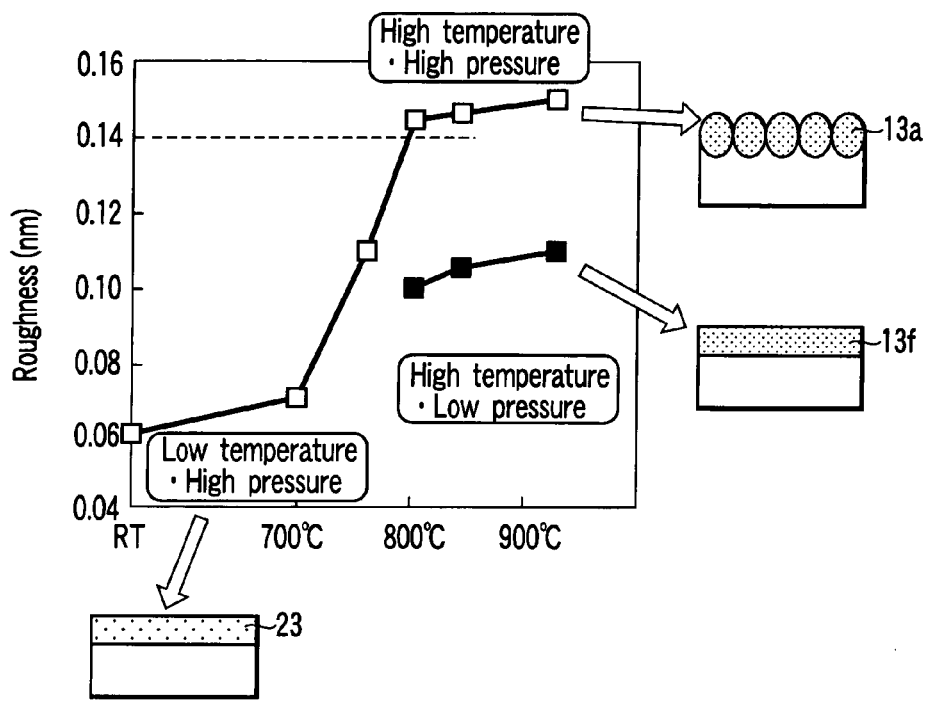
FIG. 8 is a characteristic diagram for explaining the effect of the second embodiment, illustrating relationship between a process temperature and a roughness state (surface roughness) of the surface of a silicon nitride film.
Figure 9:
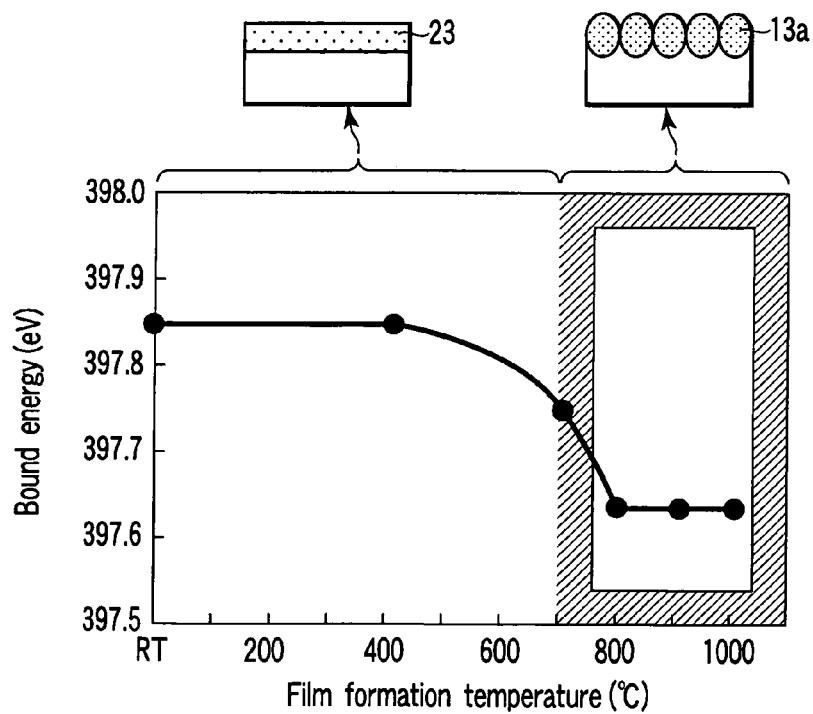
FIG. 9 is a characteristic diagram for explaining the effect of the second embodiment, illustrating a silicon nitride film forming temperature and a bond state.

Forming a triple coordinate silicon nitride film 13a which is agglomerated and has projections and depressions requires nitriding at a high temperature of 800° C. or more, as shown in FIGS. 8 and 9. FIG. 8 illustrates a result of evaluation of silicon nitride film formation temperature and surface roughness (difference in height between projections and depressions) of a formed silicon nitride film. FIG. 9 illustrates the relationship between the silicon nitride film formation temperature and the bond state.

As shown in FIG. 8, at a low temperature up to 700° C., the increment of roughness is very small, and the roughness is about 0.07 even at 700° C. Further, at such a low temperature, three-coordinate nitrogen cannot be formed as shown in FIG. 9, and the surface of the nitride film is flat.

The roughness rapidly increases between 700° C. and 800° C., and the roughness at 800° C. exceeds 0.14. At a temperature exceeding 800° C., the roughness hardly increases, and the roughness at 900° C. is about 0.15. Specifically, the roughness is set to 0.14 nm or more by setting the silicon nitride film formation temperature to a high temperature of 800° C. or more, and it is possible to form a triple coordinate silicon nitride film 13a having a desired roughness.

The pressure in nitriding also has an influence on the roughness. Even at high temperature, if nitriding is performed at low pressure, a flat triple coordinate silicon nitride film 13f is formed as shown in FIG. 8.

Figure 10:
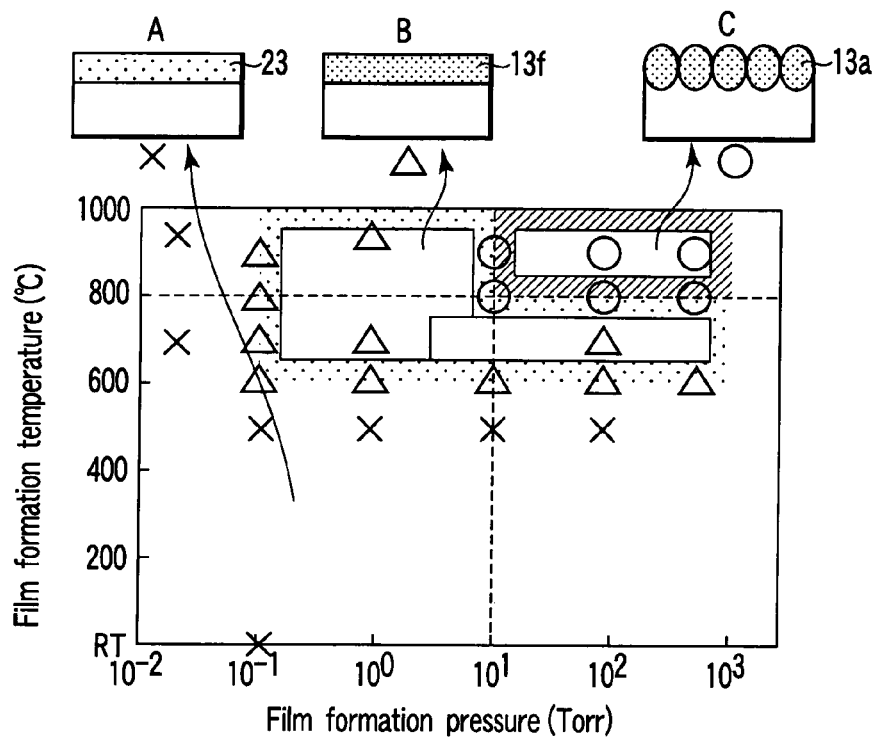
FIG. 10 is a schematic diagram for explaining the effect of the second embodiment, illustrating the relationship between the temperature and pressure in formation of the silicon nitride film and film quality of the silicon nitride film.

FIG. 10 is a characteristic diagram illustrating the film formation temperature and the film formation pressure in formation of the silicon nitride film, and the influence of the temperature and pressure on the film quality. At a film formation temperature less than 600° C., a triple coordinate silicon nitride film cannot be formed, and a double coordinate silicon nitride film 23 is formed as shown by A of FIG. 10. Although nitriding at a high temperature of 600° C. or more enables formation of a triple coordinate silicon nitride film, a flat film 13f is formed as shown by B of FIG. 10 with a film formation temperature of less than 800° C. Even with a film formation temperature of 800° C. or more, if the pressure is less than 10 Torr (13 Pa), a flat film 13f is formed.

In comparison with this, in the embodiment, nitriding is performed at a temperature of at least 800° C. and a film formation pressure of at least 10 Torr (13 Pa), and thereby a agglomerated silicon nitride film 13a having projections and depressions is formed, as shown by C of FIG. 10. This is because the high pressure increases the amount of nitrogen which reach the surface of the silicon substrate, and promotes nitriding.

In consideration of the above, in the process of forming the tunnel insulating film used in the second embodiment, it is required to perform formation of a silicon nitride film of the tunnel insulating film at a high temperature of at least 800° C. and under a pressure of at least 10 Torr (13 Pa).

Figure 11:
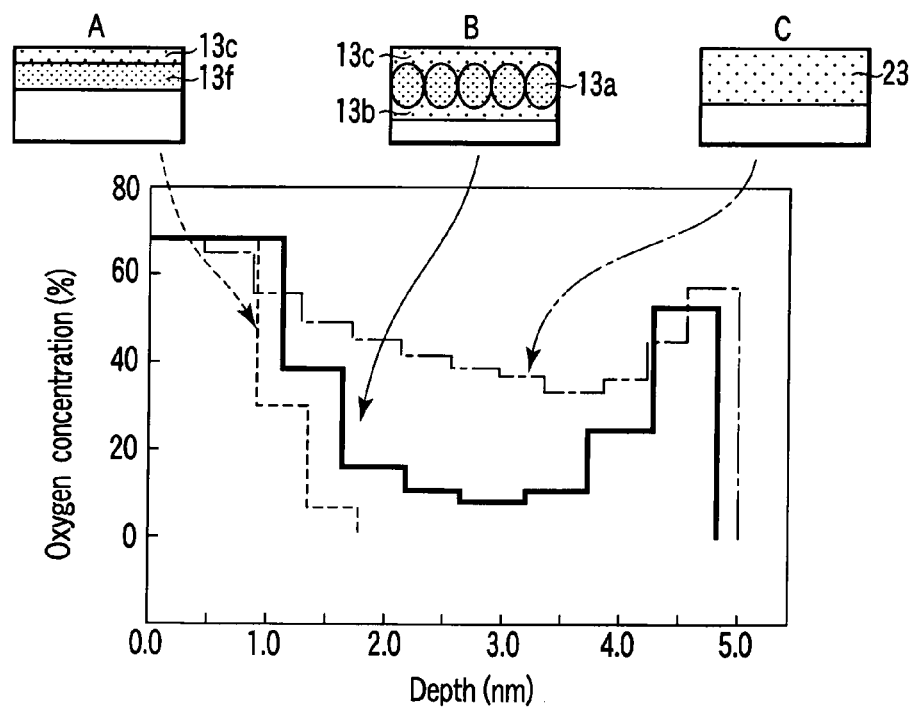
FIG. 11 is a characteristic diagram for explaining the effect of the second embodiment, illustrating oxygen density distribution in a tunnel insulating film.

FIG. 11 illustrates a profile of oxygen concentration in a tunnel insulating film formed by oxidizing the above triple coordinate silicon nitride film having projections and depressions. A silicon nitride film formed of triple coordinate nitrogen is not easily oxidized by introduction of oxygen. Therefore, in a flat silicon nitride film 13f as shown by A of FIG. 11, oxygen cannot reach the interface between the silicon substrate and the silicon nitride film as described above.

In the meantime, in a silicon nitride film 23 having unstable double coordinate nitrogen bond, oxygen easily enters the silicon nitride film as shown by C of FIG. 11. Therefore, even in a flat film, the silicon nitride film is also broken simultaneously with arrival of oxygen at the interface between the silicon substrate and the silicon nitride film, and an oxynitride film is formed. This film easily generates defects when a high electric-field stress is applied.

In comparison with this, if the silicon nitride film 13a formed of agglomerated triple coordinate nitrogen bond according to the second embodiment is used as shown by B of FIG. 11, the structure of the silicon nitride film 13a is not easily broken by oxygen introduction since it has triple coordination. Further, oxygen is introduced through the depressions of the agglomerated silicon nitride film 13a, and thereby the silicon oxide film 13b is formed in the interface between the silicon substrate and the silicon nitride film. Consequently, a tunnel insulating film 13 is formed, comprising the silicon nitride film 13a held between the silicon oxide films 13b and 13c, as shown in FIG. 2.

Figure 12:
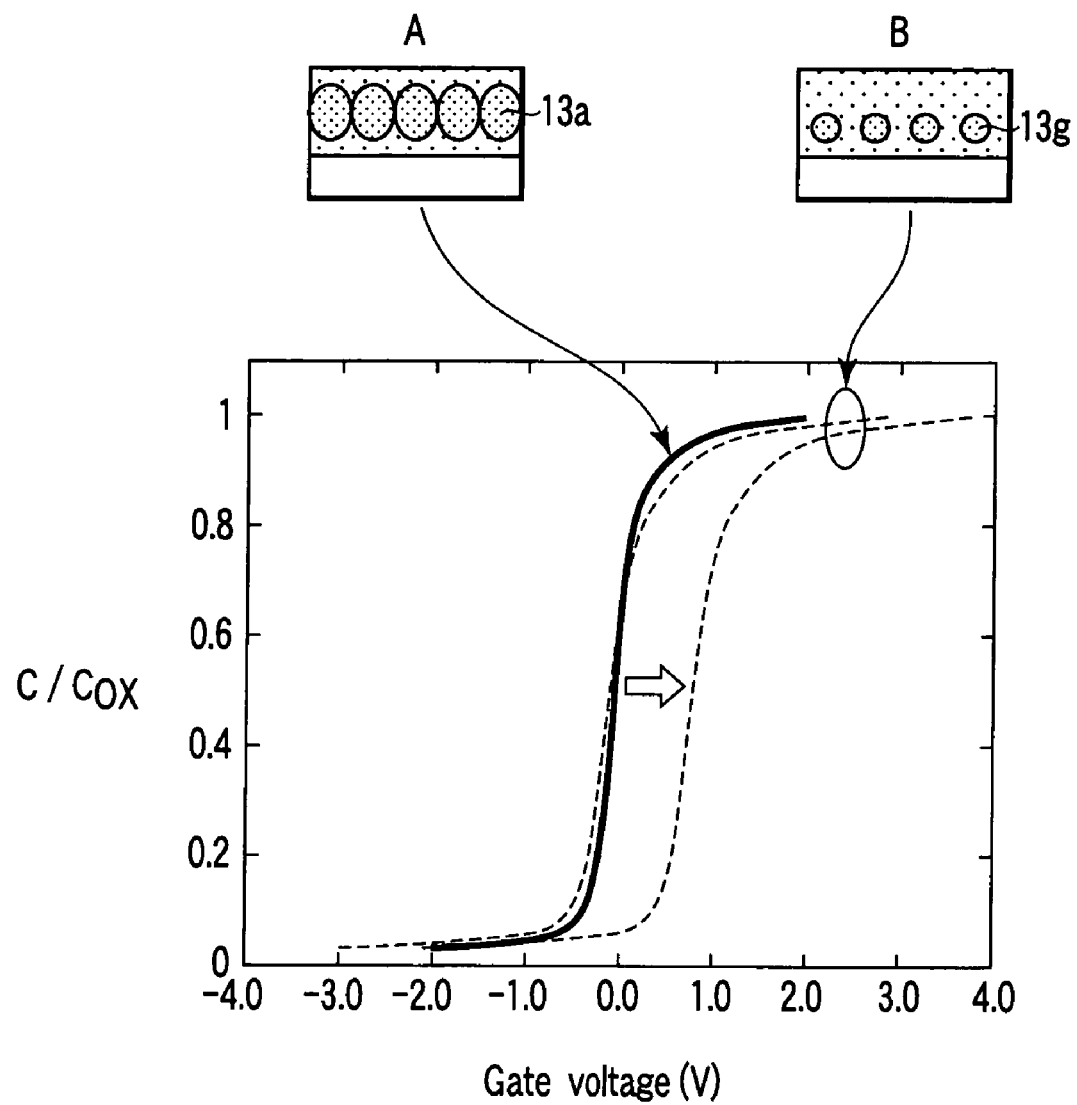
FIG. 12 is a characteristic diagram for explaining the effect of the second embodiment, illustrating the relationship between a voltage applied to the tunnel insulating film and the capacity.

FIG. 12 is a characteristic diagram of MOS structures comprising a continuous silicon nitride film, or a discontinuous silicon nitride film, held between silicon oxide films. The horizontal axis indicates gate voltage, and the vertical axis indicates capacity value defined by a capacity (Cox) when a voltage of 4 MV/cm is applied to the insulating film. The structure comprising a continuous or discontinuous film held between silicon oxide films is publicly known as MONOS memory or dot memory. In these publicly-known examples, the silicon nitride film itself is used as a place to trap charges to obtain memory property.

As an example, the embodiment A is compared with a dot silicon nitride film (particulate silicon nitride film 13g) B. Since a MONOS memory and dot memory utilizes trap formation of a silicon nitride film, the silicon nitride film to be used includes double coordinate nitrogen. Thereby, charges are trapped in the silicon nitride film by applying a high electric field, and the voltage/capacity characteristic thereof shifts in correlation with the polarity and quantity of the trapped charges. The Example of B in FIG. 12 illustrates the case where electrons are trapped by the silicon nitride film dots 13g.

In comparison with this, in the second embodiment, since the tunnel insulating film 13 comprises the silicon nitride film 13a including triple coordinate nitrogen bond which suppresses trap generation, as in the example A of FIG. 12, the voltage/capacity characteristic does not shift after application of high-electric-field stress.

Third Embodiment

FIGS. 13A to 13I are cross-sectional views illustrating steps of manufacturing a nonvolatile semiconductor memory device according to a third embodiment of the present invention. The same constituent elements as those in FIG. 1 are denoted by the same respective reference numerals, and detailed explanation thereof is omitted.

Figure 13A:
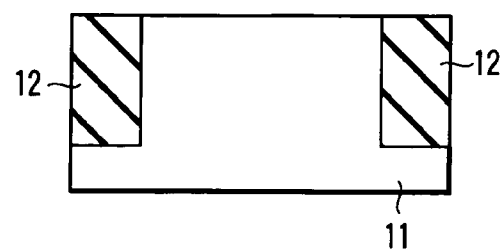
FIGS. 13A to 13I are cross-sectional views illustrating manufacturing steps of a nonvolatile semiconductor memory device according to a third embodiment of the present invention.

First, as shown in FIG. 13A, prepared is a p type silicon substrate 11 having, for example, a surface orientation of (100) and a resistivity of 10 to 20 Ωcm. Grooves are formed in the surface of the p type silicon substrate 11, and CVD oxide films are embedded therein. Thereby, device isolation insulating films 12 each having an about 0.6 μm thickness are formed.

Figure 13B:
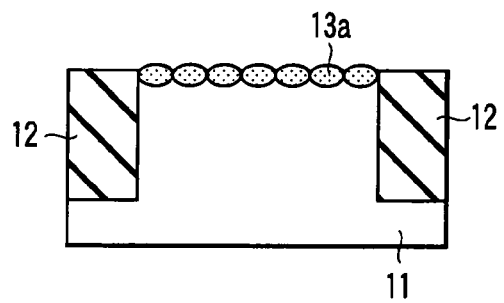
Figure 13C:
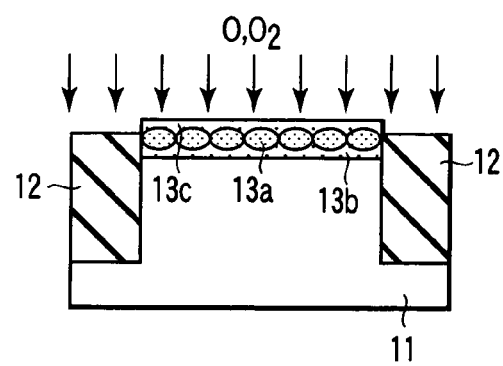
Figure 13D:
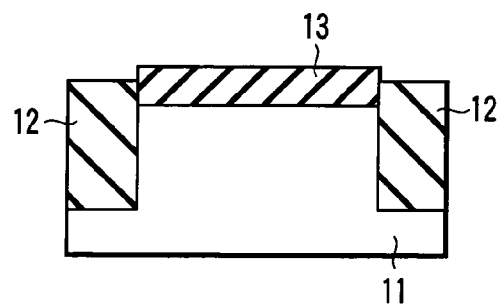
Figure 13E:
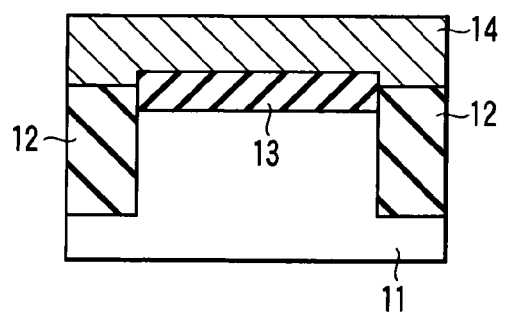

Next, as shown in FIG. 13B, a silicon nitride film 13a having a 4 nm thickness is formed on the main surface of the substrate 11 by using plasma nitriding, at a temperature of 900° C. and a pressure of 50 Torr (67 Pa). Then, as shown in FIG. 13C, the silicon nitride film 13a is exposed to an oxygen gas atmosphere to introduce oxygen atoms. Thereby, as shown in FIG. 13D, formed is a tunnel insulating film (first gate insulating film) 13 comprising the silicon nitride film 13a held between silicon nitride films 13b and 13c. Thereafter, as shown in FIG. 13E, a phosphorus-doped n-type polycrystalline silicon film with a 200 nm thickness is deposited as a floating gate electrode 14 on the tunnel insulating film 13.

Figure 13F:
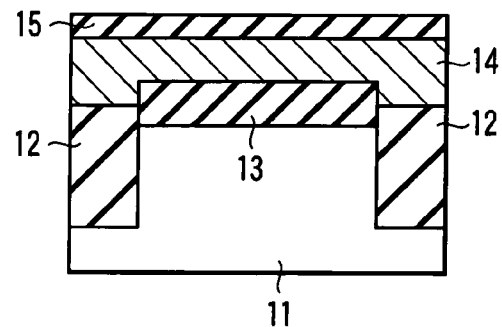
Figure 13G:
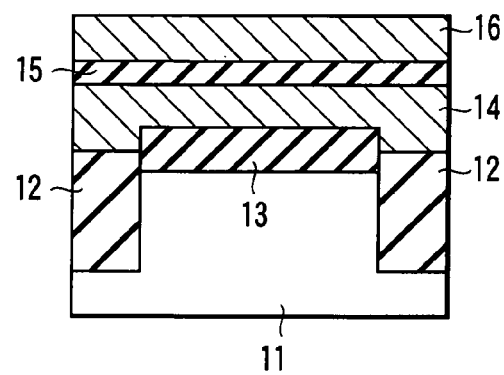

Next, as shown in FIG. 13F, an ONO film 15 having a 7 nm thickness, for example, is formed as an interelectrode insulating film (second gate insulating film) on the polycrystalline silicon film serving as the floating gate electrode 14. Then, as shown in FIG. 13G, a phosphorus-doped n-type polycrystalline silicon film having a 200 nm thickness is deposited as a control gate electrode 16 on the ONO film 15.

Figure 13H:
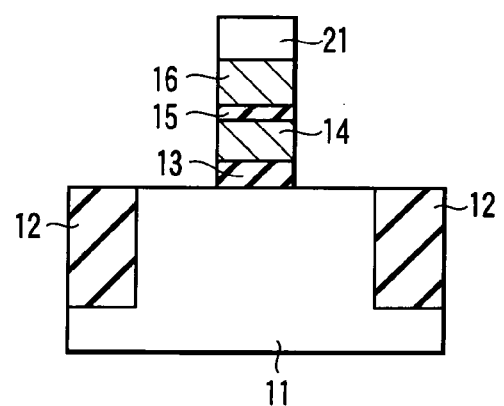

Next, as shown in FIG. 13H, a resist mask 21 is formed, and thereafter the polycrystalline silicon film 16, 14, the tunnel insulating film 13 and the ONO film 15 are etched by reactive ion etching to form a gate portion. Then, after the resist mask 21 is removed, the structure is subjected to heat treatment in an oxidizing atmosphere for the purpose of recovery from processing damage, and an after oxide film 17 of about 3 nm is formed. Parts of the silicon oxide film 17 on the control gate electrode 16 and on the source/drain regions are removed for wire formation described below.

Figure 13I:
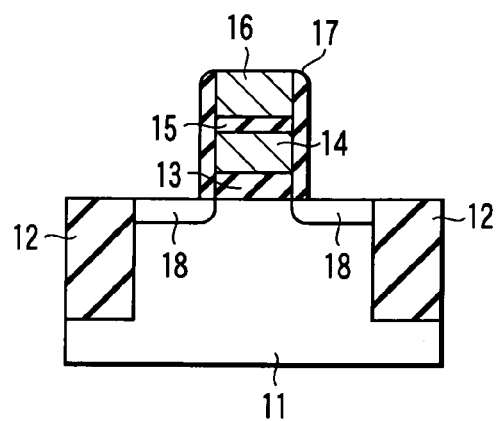

Next, for example, $3 \times 10^{15}$ cm$^{-2}$ of phosphorous ions are injected into the whole surface, and the structure is subjected to heat treatment at 1000° C. for 20 seconds to diffuse and activate the phosphorus in the silicon substrate 11. Thereby, diffusion layers 18 serving as source/drain regions are formed. By the above steps, the structure shown in FIG. 13I is obtained.

The steps following the above are not specifically illustrated. For example, a silicon oxide film of a 300 nm thickness is deposited on the whole surface by CVD, and then a contact hole is provided in the silicon oxide film by anisotropic dry etching. Thereafter, an aluminum film having a 800 nm thickness and containing, for example, 0.5% of silicon and 0.5% of copper is formed, and an electrode is formed by patterning the aluminum film. Then, the structure is subjected to heat treatment in a nitrogen atmosphere containing 10% of hydrogen, at 450° C. for 15 minutes.

As described above, according to the third embodiment, the silicon nitride film which forms the tunnel insulating film 13 includes triple coordinate bonds, and thereby it is possible to form a nonvolatile semiconductor memory device having a high-quality and high-reliable tunnel insulating film 13. Further, by setting the thickness of the silicon nitride film forming the tunnel insulating film 13 to 4 nm and each of the silicon oxide films to 2 nm, the physical thickness of the tunnel insulating film 13 is 8 nm, and the oxide film converted thickness (EOT) is 6 nm. Specifically, the tunnel insulating film itself is thinned. This contributes to reduction in the power supply voltage, and enables improvement not only in the property but also in the reliability of the device.

Although direct nitriding using nitrogen plasma is explained as an example of the method of forming a silicon nitride film including triple coordinate nitrogen bonds, the present invention is not limited to it. For example, the same effect is obtained by nitriding using ammonia ($NH_3$) gas or nitrogen radicals. In the case of using ammonia gas, hydrogen is introduced into the silicon nitride film. Therefore, the hydrogen in the film may be removed by heat treatment in a vacuum or in nitrogen or inert gas at a temperature higher than the silicon nitride film formation temperature, after the silicon nitride film is formed.

If heat treatment is performed in a vacuum or in nitrogen or inert gas at a temperature higher than the nitriding temperature after the silicon nitride film is formed, relaxation of the structure of the silicon nitride film is promoted, and it is possible to obtain a triple coordinate silicon nitride film having a more stable structure. This holds true not only for the case of forming a silicon nitride film by ammonia gas, but also for the case of forming a silicon nitride film by other methods.

Further, although oxidation using oxygen ($O_2$) gas is explained as an example of the oxidation (FIG. 13C) after formation of the silicon nitride film, the present invention is not limited to it. For example, the same effect is obtained by oxidation using ozone ($O_3$) gas, gas containing water vapor ($H_2O$), oxygen radicals, or dinitrogen monoxide ($N_2O$) gas. However, if nitric oxide (NO) gas is used for the oxidation, nitrogen is introduced into the silicon oxide film formed in the interface between the silicon nitride film and the silicon substrate. The nitrogen easily forms double coordinate nitrogen bond, thus may cause deterioration in the interface property and increase in traps.

Therefore, it is not desirable to use NO gas. Further, the oxidation is preferably performed at 900° C. or more, to improve the quality of the silicon oxide films to be formed.

Fourth Embodiment

FIGS. 14A to 14D are cross-sectional views illustrating steps of manufacturing a nonvolatile semiconductor memory device according to a fourth embodiment of the present invention. The same constituent elements as those in FIG. 1 are denoted by the same respective reference numerals, and detailed explanation thereof is omitted.

The steps up to formation of a polycrystalline silicon film serving as a floating gate electrode 14 are the same as the steps shown in FIGS. 13A to 13E.

Figure 14A:
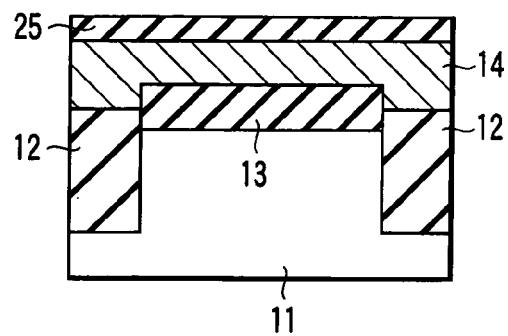
FIGS. 14A to 14D are cross-sectional views illustrating manufacturing steps of a nonvolatile semiconductor memory device according to a fourth embodiment of the present invention.
Figure 14B:
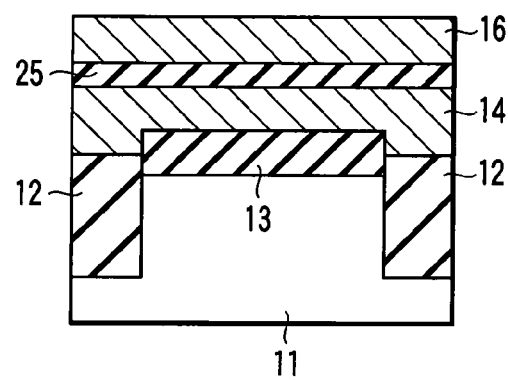

Next, as shown in FIG. 14A, an aluminum oxide film 25 having a 15 nm thickness or the like is deposited as an inter-electrode insulating film (second gate insulating film) by CVD on the polycrystalline silicon film serving as the floating gate electrode 14. Next, as shown in FIG. 14B, a phosphorus-doped n-type polycrystalline silicon film having a 200 nm thickness is deposited as a control gate electrode 16 on the aluminum oxide film 25.

Figure 14C:
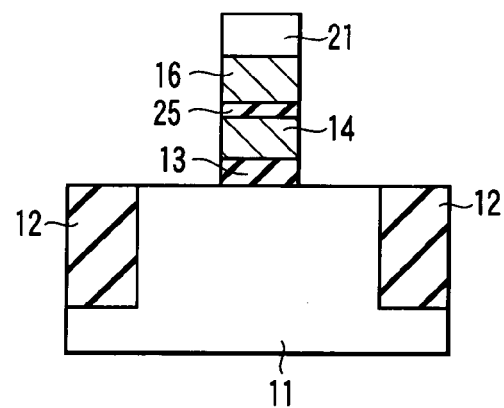

Next, as shown in FIG. 14C, a resist mask 21 is formed, and thereafter the polycrystalline silicon film 16 and 14, the tunnel insulating film 13 and the aluminum oxide film 25 are etched by reactive ion etching to form a gate electrode portion. Then, after the resist mask 21 is removed, the structure is subjected to heat treatment in an oxidizing atmosphere for the purpose of recovery from processing damage, and an after oxide film 17 of about 3 nm is formed.

Figure 14D:
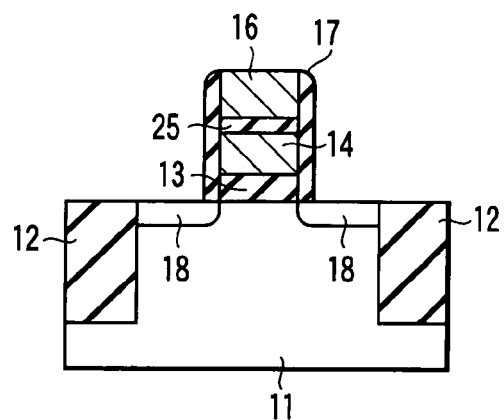

Next, for example, $3 \times 10^{15}$ $cm^{-2}$ of phosphorous ions are injected into the whole surface, and the structure is subjected to heat treatment at 1000° C. for 20 seconds to diffuse and activate the phosphorus in the silicon substrate 11. Thereby, diffusion layers 18 serving as source/drain regions are formed. By the above steps, the structure shown in FIG. 14D is obtained.

The steps following the above are not specifically illustrated. In the same manner as in the third embodiment, a silicon oxide film is deposited by CVD, and then a contact hole is provided in the silicon oxide film. Thereafter, an aluminum film is formed, and an electrode is formed by patterning the aluminum film. Then, the structure is subjected to heat treatment in a nitrogen atmosphere.

According to the fourth embodiment, the insulating film between the floating gate electrode 14 and the control gate electrode 16 is formed of the aluminum oxide film 25 being a high dielectric film. Therefore, it is possible to increase the coupling ratio with the tunnel insulating film 13. It is thus possible to make a gate electrode portion having a simple plane stacked structure, and solve the problem of interference between cells due to scale down of the device.

Figure 15:
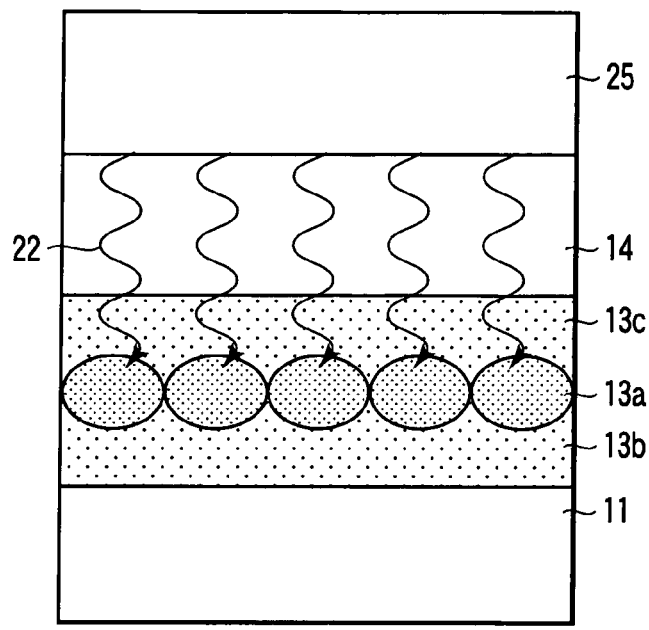
FIG. 15 is a cross-sectional view for explaining the effect of the fourth embodiment, illustrating a specific structure of a tunnel insulating film.

If a high dielectric film 25 formed of metal oxide or the like is provided between the floating gate electrode 14 and the control gate electrode 16, metal impurities 22 are diffused through particle boundaries in the polycrystalline silicon film of the floating gate electrode 14, and introduced into the tunnel insulating film 13 as shown in FIG. 15. In conventional tunnel insulating films, since the metal impurities 22 are easily introduced into the film, traps are formed and the resistance to pressure is greatly deteriorated.

In comparison with this, in the case of using the tunnel insulating film 13 of the fourth embodiment, the silicon nitride film 13a having a stable structure prevents diffusion of the metal impurities 22. Simultaneously, a stacked structure of the tunnel insulating film 13 including the silicon oxide films 13b and 13c and the silicon nitride film 13a prevents defects formed in stress application due to the metal impurities from being connected from the floating gate electrode 14 and the silicon substrate interface. Therefore, it is also possible to suppress deterioration in the resistance to breakdown.

In the above embodiment, although an aluminum oxide ($Al_2O_3$) film is adopted as an example of the high-dielectric film 25 located between the floating gate electrode 14 and the control gate electrode 16, the present invention is not limited to it. For example, the same effect is obtained by using a metal oxide having a high dielectric constant, an aluminate film ($MA_1O_X$, M: metal element, x: oxygen content), a silicate film ($MsiO_X$, M: metal element, x: oxygen content), an oxide of transition element such as $HfO_2$, $ZrO_2$ and $CeO_2$, and metal oxide such as $Ln_2O_3$. Further, if the interelectrode dielectric film is formed of a stacked layer of aluminum oxide and hafnium oxide, defects such as oxygen deficit in the aluminum oxide film are resolved with atomic oxygen at low temperature, and thereby a structure with a reduced leak current is obtained.

Fifth Embodiment

Figure 16:
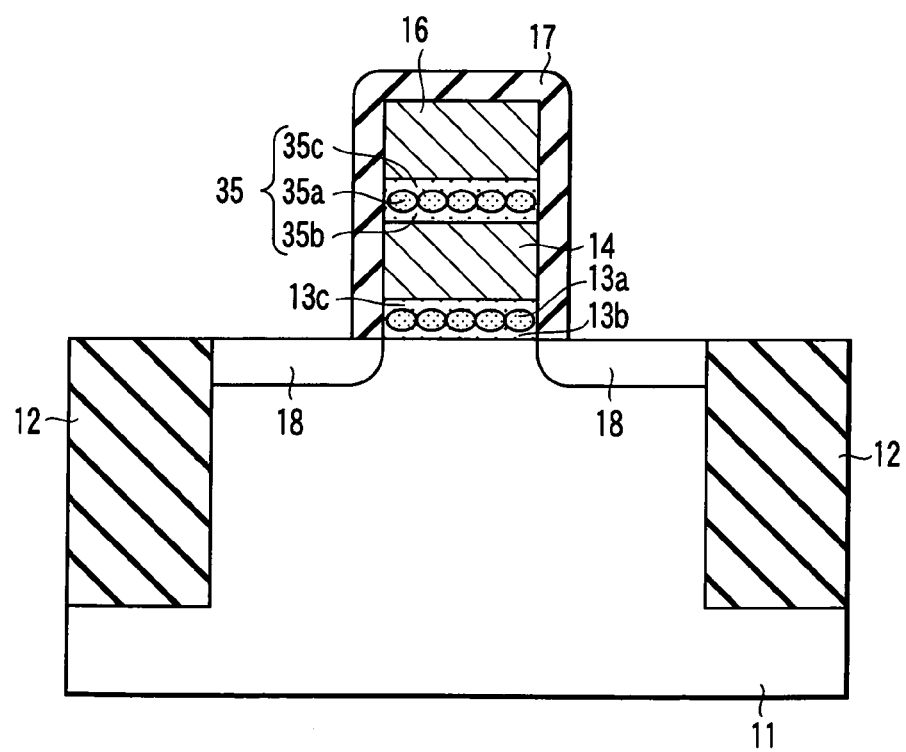
FIG. 16 is a cross-sectional view illustrating a schematic structure of a nonvolatile semiconductor memory device according to a fifth embodiment of the present invention.

FIG. 16 is a cross-sectional view illustrating a schematic structure of a nonvolatile semiconductor memory device according to a fifth embodiment of the present invention.

In the fifth embodiment, silicon oxide films 12 for device isolation are formed on a p type silicon substrate 11. In the surface of the silicon substrate 11, n-type source/drain diffusion layers 18 are formed by phosphorus ion implantation. A tunnel insulating film (first gate insulating film) 13 having a stacked structure formed of a silicon nitride film 13*a* held between silicon oxide films 13*b* and 13*c* is formed on the surface of the silicon substrate 11. A polycrystalline silicon film serving as a floating gate electrode 14 is formed on the tunnel insulating film 13.

On the floating gate electrode 14, formed is an interelectrode insulating film 35 serving as a second gate insulating film. The interelectrode insulating film 35 has a stacked structure formed of a silicon nitride film 35*a* held between silicon oxide films 35*b* and 35*c*. A polycrystalline silicon film serving as a control gate electrode 16 is formed on the interelectrode insulating film 35. Further, a silicon oxide film 17 is formed on side walls of the gate electrodes 14 and 16.

Specifically, the interelectrode insulating film has the structure in which the silicon nitride film 35*a* is held between the silicon oxide films 35*b* and 35*c*, in the same manner as the tunnel insulating film 13. The other parts of the memory device are the same as those in the structure of the device in FIG. 1. The silicon nitride film 35*a* is obtained by directly nitriding the floating gate electrode 14. By performing the nitriding at high temperature, nitrogen includes triple coordinate bonds.

According to the above structure, the interelectrode insulating film 35 held between the floating gate electrode 14 and the control gate electrode 16 also has the insulating film structure as shown in FIG. 3. This structure further improves the reliability of the device, and simultaneously reduces the drive voltage of the device.

Sixth Embodiment

FIGS. 17A to 17D are cross-sectional views illustrating steps of manufacturing a nonvolatile semiconductor memory device according to a sixth embodiment of the present invention. The same constituent elements as those in FIG. 1 are denoted by the same respective reference numerals, and detailed explanation thereof is omitted.

Steps up to formation of a polysilicon film serving as a floating gate electrode 14 are the same as the steps shown in FIGS. 13A to 13E.

Figure 17A:
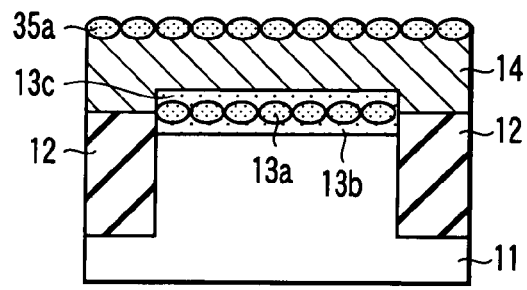
FIGS. 17A to 17D are cross-sectional views illustrating manufacturing steps of a nonvolatile semiconductor memory device according to a sixth embodiment.
Figure 17B:
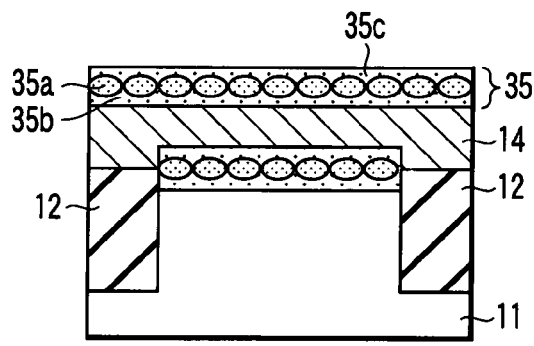

Next, as shown in FIG. 17A, a silicon nitride film 35*a* having a 4 nm thickness is formed on the polycrystalline silicon film serving as the floating gate electrode 14, by using plasma nitriding or the like at a 900° C. temperature and a pressure of 50 Torr (67 Pa). Then, the silicon nitride film 35*a* is exposed to, for example, an oxygen gas atmosphere to introduce oxygen atoms into the film. Thereby, as shown in FIG. 17B, formed is an interelectrode insulating film (second gate insulating film) 35 formed of the silicon nitride film 35*a* held between silicon oxide films 35*b* and 35*c*.

Figure 17C:
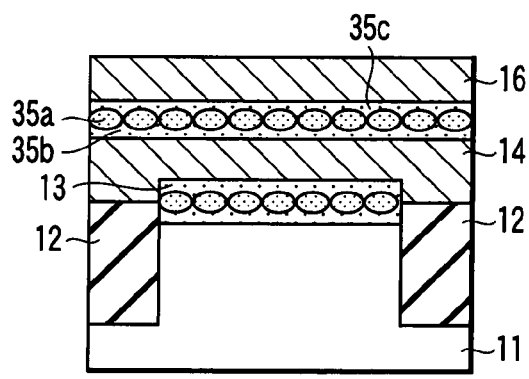

Next, as shown in FIG. 17C, a phosphorus-doped n-type polycrystalline silicon film having a 200 nm thickness is deposited as a control gate electrode 16 on the interelectrode insulating film 35.

Next, although not shown in the embodiment, patterning is performed with a resist mask used, and thereafter the polycrystalline silicon films 16 and 14, the tunnel insulating film 13 and the interlayer insulating film 35 are etched by reactive ion etching to form a gate electrode portion. Then, after the resist mask is removed, the structure is subjected to heat treatment in an oxidizing atmosphere for the purpose of recovery from processing damage, and an after oxide film 17 of about 3 nm is formed.

Figure 17D:
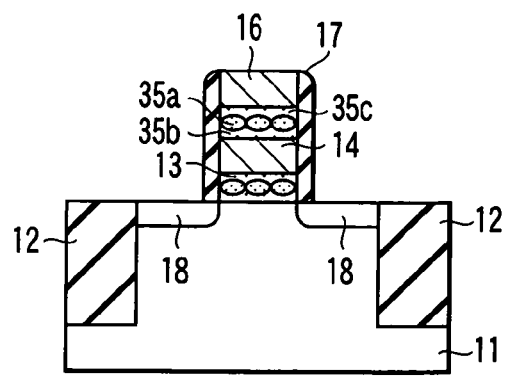

Next, for example, $3\times10^{15}$ cm$^{-2}$ of phosphorous ions are injected into the whole surface, and the structure is subjected to heat treatment at 1000° C. for 20 seconds to diffuse and activate the phosphorus in the silicon substrate 11. Thereby, diffusion layers 18 serving as source/drain regions are formed. By the above steps, the structure shown in FIG. 17D is obtained.

The steps following the above are not specifically illustrated. In the same manner as in the third embodiment, a silicon oxide film is deposited by CVD, and then a contact hole is provided in the silicon oxide film. Thereafter, an aluminum film is formed, and then an electrode is formed by patterning the aluminum film. Then, the structure is subjected to heat treatment in a nitrogen atmosphere.

Direct nitriding using nitrogen plasma has been explained as an example of the method of forming a silicon nitride film including triple coordinate nitrogen bonds, in the step of forming the interelectrode insulating film 35 held between the floating gate electrode 14 and the control gate electrode 16. However, the embodiment is not limited to it, but various modifications are possible as explained in the third embodiment.

Further, oxidation using oxygen ($O_2$) gas has been explained as an example of the oxidation performed after formation of the silicon nitride film. However, the embodiment is not limited to it, but various modifications are possible as explained in the third embodiment. Further, the oxidation is preferably performed at 900° C. or more, to improve the quality of the silicon oxide films to be formed.

Seventh Embodiment

FIGS. 18A to 18E are cross-sectional views illustrating steps of manufacturing a nonvolatile semiconductor memory device according to a seventh embodiment of the present invention. The same constituent elements as those in FIG. 1 are denoted by the same respective reference numerals, and detailed explanation thereof is omitted.

In FIGS. 7A to 7D, the structure is exposed to an oxidizing gas such as oxygen after formation of the silicon nitride film, and thereby the silicon oxide films are formed to hold the silicon nitride film therebetween. However, since the silicon nitride film has triple coordinate bond, the surface of the silicon nitride film has slow oxidation speed.

Figure 18A:
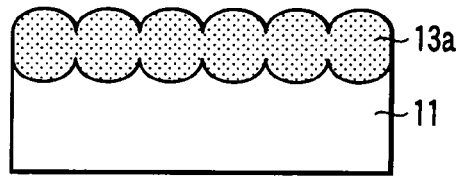
FIGS. 18A to 18E are cross-sectional views illustrating manufacturing steps of a nonvolatile semiconductor memory device according to a seventh embodiment.
Figure 18B:
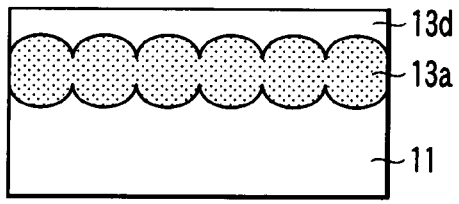
Figure 18C:
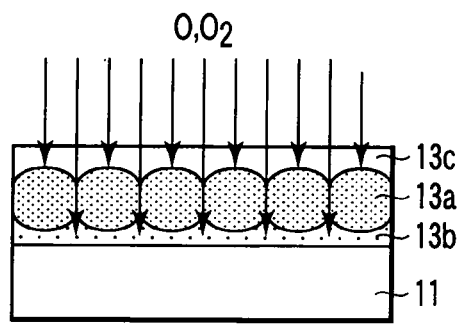
Figure 18D:
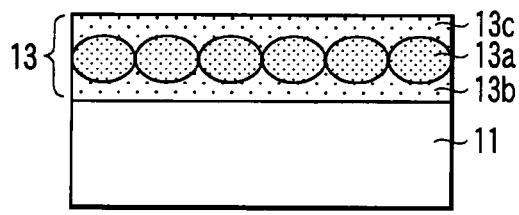
Figure 18E:
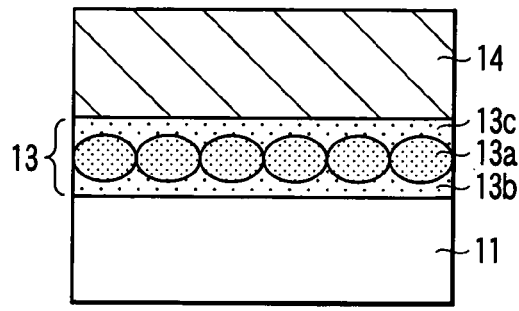

To solve this problem, in the seventh embodiment, after a silicon nitride film 13*a* is formed as shown in FIG. 18A, a silicon film 13*d* deposited thereon as shown in FIG. 18B. Thereafter, as shown in FIG. 18C, the structure is exposed to an oxidizing gas such as oxygen, and thereby the silicon oxide film 13d is oxidized and a silicon oxide film 13c is formed. Simultaneously, oxidant passes through the silicon nitride film 13a, and a silicon oxide film 13b is formed in a region held between the substrate 11 and the silicon nitride film 13a. Thereby, formed is a tunnel insulating film (first gate insulating film) 13 having a structure in which the silicon nitride film 13a is held between the silicon oxide films 13b and 13c. Thereafter, a polycrystalline silicon film is deposited thereon to form a floating gate electrode 14.

By adopting the above process, it is possible to control the thickness of the silicon oxide film 13c on the silicon nitride film 13a by the thickness of the silicon film 13d to be deposited. The silicon film 13d formed on the silicon nitride film 13a may be any of an amorphous silicon film, a polycrystalline silicon film and a monocrystalline silicon film. It is desirably an amorphous silicon film for uniform deposition on the surface of the silicon nitride film.

Figure 19:
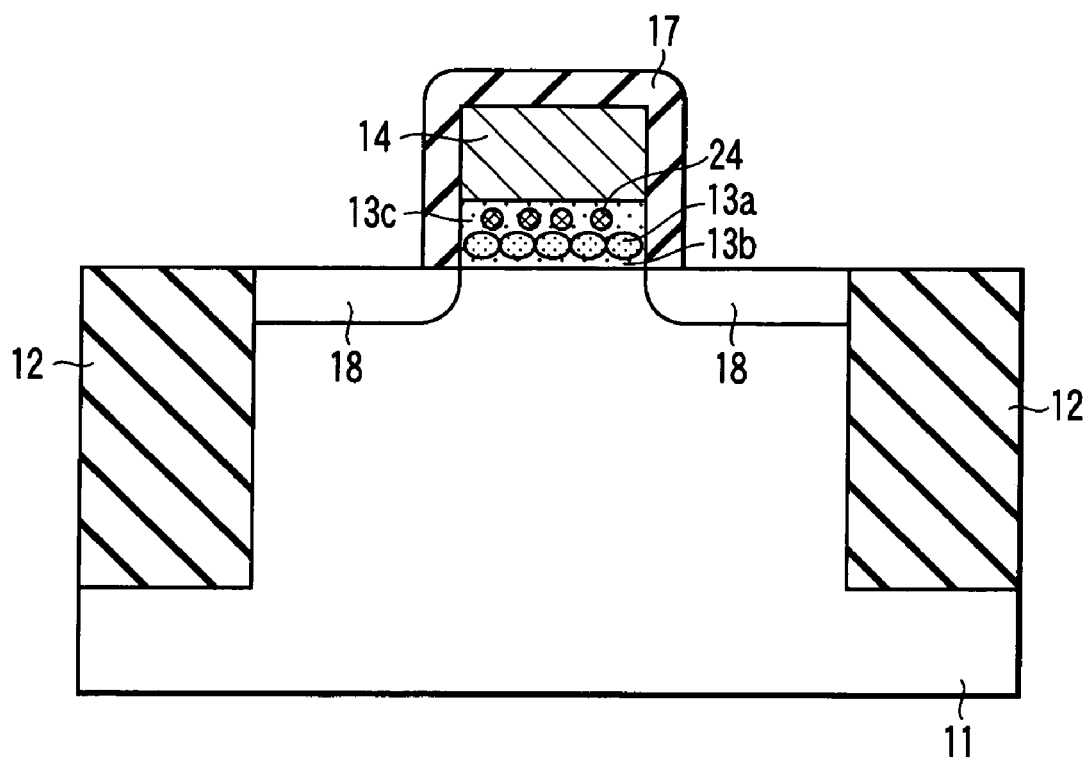
FIG. 19 is a cross-sectional view for explaining a modification of the nonvolatile semiconductor memory device according to the seventh embodiment, illustrating an example of a semiconductor memory device using the particle effect.

Although the silicon film 13d may be a polycrystalline silicon film, the silicon crystal particles thereof have different surface orientations. Therefore, if the oxidation amount is insufficient, there are cases where silicon particles 24 remain in the silicon oxide film 13c, as shown in FIG. 19. Although it is basically undesirable that the silicon particles 24 remain, it is possible to positively use the phenomenon and form a semiconductor memory device utilizing the effects of the particles, such as storing charges in the silicon particles 24.

Further, if the silicon film is deposited at a high temperature of 700° C. by using, for example, a silane ($SiH_4$) gas and dichlorsilane ($SiH_2Cl_2$) gas, the deposited silicon film is a monocrystalline silicon film. Since a monocrystalline silicon film is uniformly oxidized, it is possible to form a silicon oxide film 13c with a higher quality.

MODIFICATION

The present invention is not limited to the above embodiments. Although silicon is used as the substrate in the embodiments, it is possible to use a substrate of other semiconductors. Further, if a single-layer film is used as the second gate insulating film, an insulator having a dielectric constant higher than that of the silicon oxide films is preferably used, to heighten the coupling ratio with the control gate electrode and the floating gate electrode. For example, it is desirable to use a metal oxide, a metal silicate film, or a metal aluminate film as the insulator.

Further, the method of forming a silicon nitride film on the substrate in formation of the first gate insulating film is not necessarily limited to plasma nitriding. Any method can be adopted as long as it is a method of forming a silicon nitride film by directly nitriding the substrate. Although the nitriding temperature and the nitriding pressure can be changed according to necessity, they are preferably set to a temperature of at least 800° C., and a pressure of at least 13 Pa, to obtain triple coordinate nitrogen bonds and provide projections and depressions to the surfaces of the film. Further, the temperature in formation of oxide films after the silicon nitride film is formed is preferably 900° C. or more to obtain silicon oxide films of high quality.

Furthermore, the material of the floating gate electrode and the control gate electrode are not necessarily limited to polycrystalline silicon, but it is possible to use other conductive materials. However, if the second gate insulating film is structured in the same manner as the first gate insulating film as in the fifth and sixth embodiments, it is required that the floating gate electrode is formed of silicon.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a silicon layer of a first conductivity type; and
   a gate element formed on the silicon layer, and comprising:
      a tunnel insulating film which is selectively formed on a main surface of the silicon layer, the tunnel insulating film forming a three-layer structure including a silicon nitride film and silicon oxide films between which the silicon nitride film is sandwiched, the silicon nitride film including an uneven surface with projections and depressions, and triple coordinate nitrogen bonds, the triple coordinate nitrogen bonds including a nitrogen atom which is bonded to three silicon atoms and has no dangling bonds, an upper surface of an upper one of the silicon oxide films being more planar than the silicon nitride film, the silicon nitride film being continuously formed in an in-plane direction, an average of differences between the projections and depressions being set at 0.14 nm or more;
      a floating gate electrode formed on the tunnel insulating film;
      an interelectrode insulating film formed on the floating gate electrode;
      a control gate electrode formed on the interelectrode insulating film; and
      source and drain regions of a second conductivity type, the source and drain regions being formed in the main surface of the silicon layer with the gate element being arranged between the source and drain regions.

2. A nonvolatile semiconductor memory device according to claim 1, wherein the interelectrode insulating film is formed of a three-layer structure including a silicon nitride film and silicon oxide films between which the silicon nitride film is sandwiched, the silicon nitride film including triple coordinate nitrogen bonds.

3. A nonvolatile semiconductor memory device according to claim 1, wherein the interelectrode insulating film is formed of an insulating film having a dielectric constant higher than that of the silicon oxide films.

4. A nonvolatile semiconductor memory device according to claim 3, wherein the interelectrode insulating film is formed of one of a metal oxide film, a metal silicate film, and a metal alum mate film.

5. A nonvolatile semiconductor memory device comprising:
   a silicon layer of a first conductivity type; and
   a gate element formed on the silicon layer, and comprising:
      a tunnel insulating film which is selectively formed on a main surface of the silicon layer, the tunnel insulating film forming a three-layer structure including a silicon nitride film and silicon oxide films between which the silicon nitride film is sandwiched, the silicon nitride film including an uneven surface with projections and depressions, and triple coordinate nitrogen bonds, the triple coordinate nitrogen bonds including a nitrogen atom which is bonded to three silicon atoms and has no dangling bonds, an upper surface of an upper one of the silicon oxide films being more planar than the silicon nitride film, the silicon nitride film being continuously formed in an in-plane direction, an average of differences between the projections and depressions being set at 0.14 nm or more;

a control gate electrode formed above the tunnel insulating film; and source and drain regions of a second conductivity type, the source and drain regions being formed in the main surface of the silicon layer with the gate element being arranged between the source and drain regions;

wherein when a voltage is applied to the control gate electrode, electrons are input to and output from the gate element via the tunnel insulating film.

* * * * *

UNITED STATES PATENT AND TRADEMARK OFFICE
CERTIFICATE OF CORRECTION

| | |
|---|---|
| PATENT NO. | : 7,619,274 B2 |
| APPLICATION NO. | : 11/083035 |
| DATED | : November 17, 2009 |
| INVENTOR(S) | : Mitani et al. |

Page 1 of 1

It is certified that error appears in the above-identified patent and that said Letters Patent is hereby corrected as shown below:

Claim 4, column 14, line 52, change "alum mate film" to --aluminate film--.

Signed and Sealed this

Twenty-sixth Day of January, 2010

David J. Kappos
*Director of the United States Patent and Trademark Office*